United States Patent [19]

Barzynski et al.

[11] 3,849,137

[45] Nov. 19, 1974

[54] LITHOGRAPHIC PRINTING PLATES AND PHOTORESISTS COMPRISING A PHOTOSENSITIVE POLYMER

[75] Inventors: Helmut Barzynski, Lambsheim; Mong-Jon Jun, Ludwigshafen; Dietrich Saenger, Ludwigshafen; Otto Volkert, Ludwigshafen, all of Germany

[73] Assignee: Badische Anilin- & Soda-Fabrik Aktiengesellschaft, Ludwigshafen, Germany

[22] Filed: Oct. 5, 1972

[21] Appl. No.: 295,146

[30] Foreign Application Priority Data

Oct. 12, 1972 Germany........................... 2150691

[52] U.S. Cl........................... 96/67, 96/33, 96/36.2, 96/36.2, 96/85, 96/86 P, 96/87 R, 96/115 R, 204/159.14, 260/78.4 D, 260/80 P

[51] Int. Cl............................ G03c 1/70, G03c 1/72

[58] Field of Search............ 96/115 R, 85, 86 P, 33, 96/36.2, 87, 67; 204/159.14

[56] References Cited

UNITED STATES PATENTS 3,615,629 10/1971 Wilhelm et al................... 96/115 R

OTHER PUBLICATIONS

Patchornik, J. A., et al., J. Amer. Chem. Soc., 92, 6333, 1970.

*Primary Examiner*—Ronald H. Smith

*Attorney, Agent, or Firm*—Johnston, Keil, Thompson & Shurtleff

[57] ABSTRACT

Photosensitive coating materials comprising polymers containing o-nitrocarbinol ester groups, particularly of polymers and copolymers of o-nitrocarbinol esters of ethylenically unsaturated carboxylic acids, which as a result of exposure become soluble in an alkaline solvent used as developer in which they were not soluble prior to exposure. Such materials are used in particular for coating lithographic printing plates and as photoresists.

2 Claims, No Drawings

LITHOGRAPHIC PRINTING PLATES AND PHOTORESISTS COMPRISING A PHOTOSENSITIVE POLYMER

The present invention relates to a photosensitive coating material which comprises a polymer containing o-nitrocarbinol ester groups and can be washed out after exposure with an alkaline solvent. The photosensitive coating material of the invention is used in particular for positive-working lithographic printing plates and as photoresist.

Positive-working coating materials for the production of planographic printing plates and for use as photoresist materials are known. These materials are macromolecular compounds which after exposure become soluble in solvents in which they were not soluble prior to exposure. A fairly comprehensive list of the materials used is given by J. Kosar, Light Sensitive Systems, John Wiley & Sons, New York, 1967. Conventional commercially available positive-working coating materials are based on the photochemical decomposition of diazonium salts or o-quinone diazide compounds with the formation of soluble reaction products.

These conventional materials have the disadvantage that they exhibit poor storage stability and are not thermostable. This is due to the thermal instability of the diazonium and diazide groups which readily decompose at elevated temperature with the elimination of nitrogen.

An object of the invention is to provide a macromolecular, highly photosensitive coating material which is unaffected by heat and is consequently storage-stable.

This object is achieved with a photosensitive coating material consisting essentially of a polymer which has a molecular weight of more than 500 and contains in the molecule such an amount but at least 5% by weight, with reference to the molecular weight, of aromatic or heteroaromatic o-nitrocarbinol ester groups of the formula I:

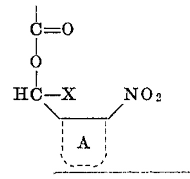

I where A denotes an aromatic or heteroaromatic optionally substituted ring system having 5 to 14 members, X denotes hydrogen, an alkyl of 1 to 8 carbon atoms or an optionally substituted aryl or aralkyl that its exposed areas can be washed out after exposure with an alkaline solvent or solvent mixture used as developer in which it was insoluble prior to exposure.

The photosensitive coating material of the invention is outstandingly suitable for planographic and offset printing plates and as photoresist. The offset printer thus has at his disposal a novel photochemically active material having valuable properties. A particular advantage of the coating material according to this invention is that it is homogeneous and not a mixture of an alkali-soluble polymer as matrix and a low molecular weight photosensitive compound. As a result, a printing plate provided with such a layer has a long press life without any lacquering of the printing areas being necessary. Moreover, the troublesome exudation of the low molecular weight component which is often observed in the case of mixtures cannot occur. Another big advantage of the coating material of the invention is that it is completely insensitive to heat, oxidation by atmospheric oxygen, reduction or catalytic decomposition by a metal base such as may occur in the case of diazonium compounds.

The special characteristic of the material of the invention is the o-nitrocarbinol ester groups of the polymer on which the coating material is based which, unlike conventional photosensitive systems, does not have to contain any other photosensitive groups such as azide and cinnamic acid radicals. Nor is the presence of phenolic hydroxyl groups in the polymer necessary.

The ring system A is a mononuclear or polynuclear aromatic or heteroaromatic 5- to 14-membered ring system having a nitro group in the ortho position. By aromatic ring systems we mean especially benzene and substituted benzenes. The benzene ring may be monosubstituted or polysubstituted, for example by $C_1$–$C_8$ alkyl, particularly methyl, by $C_1$–$C_6$ alkoxy, particulary methoxy, by halogen such as chlorine, by nitro, amino, monomethylamino or dimethylamino groups and by sulfo groups.

Appropriately substituted and unsubstituted polynuclear benzene derivatives such as naphthalene, anthracene, anthraquinone and phenanthrene may also be used.

A particularly suitable heteroaromatic ring system is pyridine.

X may be hydrogen, a saturated aliphatic alkyl of 1 to 8 carbon atoms, an aralkyl or a substituted or unsubstituted aryl which may be appropriately substituted in the aryl nucleus.

Examples of particularly suitable aromatic or heteroaromatic o-nitrocarbinols on which the o-nitrocarbinol ester groups are based are as follows: o-nitrobenzyl alcohol, 2-nitroveratryl alcohol, 6-nitroveratryl alcohol, 2-nitro-4-aminobenzyl alcohol, 2-nitro-4-dimethylaminobenzyl alcohol, 2-nitro-5-dimethylaminobenzyl alcohol, 2-nitro-5-aminobenzyl alcohol, 2-nitro-4,6-dimethoxybenzyl alcohol, 2,4-dinitrobenzyl alcohol, 3-methyl-2,4-dinitrobenzyl alcohol, 2-nitro-4-methylbenzyl alcohol, 2,4,6-trinitrobenzyl alcohol, 2-nitrobenzhydrol, 2,2'-dinitrobenzhydrol, 2,4-dinitrobenzhydrol, 2,2',4,4'-tetranitrobenzhydrol and 2-nitro-4-methylaminobenzyl alcohol.

2-nitro-3-hydroxymethyl naphthalene, 1-nitro-2-hydroxymethyl naphthalene, 1-nitro-2-hydroxymethyl anthraquinone and 3-methoxy-4-(2-nitratoethoxyl-1)-6-nitrobenzyl alcohol are, for example, equally suitable.

A specific example of a heteroaromatic o-nitrocarbinol ester group is 2-nitro-3-hydroxymethyl pyridine.

The polymer on which the photosensitive coating material is based is advantageously an organic polycarboxylic acid whose carboxyl groups are wholly or partially esterified with aromatic o-nitrocarbinols. It may be synthesized in various ways, for example by esterification of the carboxyl groups of a polycarboxylic acid with a suitable carbinol in a conventional manner. Olefinically unsaturated monomeric carboxylic acid esters which have already been esterified with an aromatic o-nitrocarbinol may be polymerized with comonomers. Aromatic o-nitrocarbinol groups may also be introduced by interesterification reactions.

Examples of advantageous organic polycarboxylic acids are polymers and copolymers of ethylenically unsaturated monocarboxylic and dicarboxylic acids having 3 to 6 carbon atoms such as acrylic acid, methacrylic acid, maleic acid, dichloromaleic acid, fumaric acid, crotonic acid, itaconic acid, α-cyanoacrylic acid, aconitic acid, citraconic acid and/or methyleneglutaric acid.

Polymers and, in particular, copolymers of the anhydrides of these olefinically unsaturated carboxylic acids, such as acrylic anhydride, methacrylic anhydride, maleic anhydride and/or dichloromaleic anhydride, as well as polymeric ammonium, alkylammonium, sodium and/or potassium salts of these acids may also be used.

Examples of suitable comonomers for the production of copolymers of the said polymerizable ethylenically unsaturated carboxylic acids are compounds having ethylenically unsaturated double bonds such as ethylene, styrene, chloroprene, isoprene and butadiene. The abovementioned unsaturated monocarboxylic and dicarboxylic acids and carboxylic anhydrides may also be used as comonomers.

Further examples of suitable comonomers are the esters of ethylenically unsaturated darboxylic acids having 3 to 6 carbon atoms with alcohols of 1 to 18 carbon atoms, such as methacrylic, acrylic, maleic and fumaric esters.

Other acrylic compounds, such as α-cyanoacrylic acid, acrylonitrile, acrylamide, N-methylolacrylamide, glycol monoacrylate, glycol monomethacrylate, propanediol-1,2-monoacrylate, propanediol-1,2-monomethacrylate, glycidyl acrylate, glycidyl methacrylate and/or 2-dimethylaminoethyl acrylate, may be used as comonomers. Specific examples of suitable vinyl comonomers are vinyl chloride, vinylidene chloride, N-vinylpyrrolidone and allyl compounds such as allyl alcohol and its esters.

To prepare the photosensitive material, the carboxyl groups of the macromolecular polycarboxylic acids used can be esterified with the appropriate o-nitrocarbinols or their derivatives.

Moreover, the alkali metal salts of the polycarboxylic acids can be boiled under reflux in aqueous solution with an aromatic or heteroaromatic o-nitrocarbinol halide, the polymeric o-nitrocarbinol ester precipitating under these conditions.

In an advantageous embodiment of the esterification reaction the polymeric carboxylic anhydrides are reacted in suitable solvents with an aromatic or heteroaromatic o-nitrocarbinol, polymeric o-nitrocarbinol half-esters still having free carboxyl groups thus being obtained.

In a particularly advantageous embodiment the o-nitrocarbinol esters of olefinically unsaturated monomeric carboxylic acids are prepared, following which the esters having the o-nitrocarbinol ester group are polymerized alone or with comonomers. These polymerization reactions can be carried out in a conventional manner.

One way of synthesizing the o-nitrocarbinol esters of olefinically unsaturated monomeric carboxylic acids is to react the monomeric acid chlorides with an aromatic or heteroaromatic o-nitrocarbinol.

The o-nitrocarbinol esters of olefinically unsaturated monomeric carboxylic acids can be prepared direct by acid-catalyzed esterification.

Another way of synthesizing aromatic or heteroaromatic o-nitrocarbinol esters of olefinically unsaturated monomeric carboxylic acids is to reesterify methyl or ethyl esters with an appropriate o-nitrocarbinol.

Polymers which contain more than 30 mol percent of units having o-nitrocarbinol ester groups are very suitable.

The photosensitive polymer containing o-nitrocarbinol ester groups, which has a molecular weight of more than 500, preferably more than 2000, and is preferably film-forming, surprisingly enters into a photochemical reaction under the action of light in which the ester group is split and a free carboxyl group is formed, with the result that the solubility of the material is decisively changed by exposure.

What is surprising is that the photochemical reaction proceeds uniformly although the formation of free radicals, crosslinking reactions and other side reactions were to be expected, particularly in view of the fact that a wide variety of reactions, some of which are very obscure, can start from nitro compounds.

The photochemical reactions proceed with high quantum yields of from 0.01 to 1 according to a mechanism which can be illustrated by the following equation using polymethacrylic acid o-nitrobenzyl ester as example:

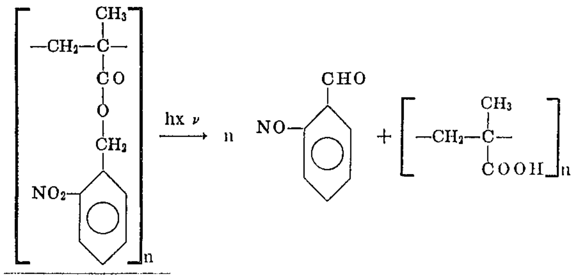

This mechanism, however, serves only as a working hypothesis because other mechanisms are conceivable. A similar mechanism has been proposed by J. A. Barltrop et al., Chem. Commun., 822 (1966), and by A. Patchornik et al., J. Amer. Chem. Soc., 92, 6333 (1970) for the photochemical reaction of low molecular weight o-nitrobenzyl esters.

The compounds used by the said authors are however liquid or crystalline and cannot be used as coating materials for lithographic printing plates or as photoresist materials. It was surprising that macromolecular polymers having o-nitrocarbinol ester groups react completely uniformly when exposed and do not enter into any kind of crosslinking reaction, thus making it possible for them to be used for the production of lithographic printing plates and as photoresist materials.

If desired, soluble dyes, pigments and other additives may be added to the photosensitive coating material of the invention. For example Palanil marine blue RE and Heliogen blue (products of Badische Anilin- & Soda-Fabrik AG, 6700 Ludwigshafen, Germany) as well as eosin and malachite green have proved to be suitable.

Sensitizers which improve the photosensitivity in general and the sensitivity of the coatings in certain wavelength ranges in particular may also be added to the photosensitive material. Examples of such sensitizers are xanthene dyes, such as fluorescein, eosin and rhodamine S, and triplet sensitizers such as are described for example by N. J. Turro, Molecular Photochemistry, W. A. Benjamin Inc., New York, 1967, page 132.

The production of printing plates using the photosensitive material of the invention is generally carried out by applying solutions of the photosensitive polymers with appropriate additives in suitable organic solvents, for example tetrahydrofuran, dioxane, acetone, and toluene, by a conventional method such as casting, dipping, spraying and whirling to a dimensionally stable rigid or flexible base, which advantageously has a hydrophilic surface, in such an amount that, after extraction or evaporation of the solvent, there is obtained a layer of photosensitive polymer having a thickness of from 0.0001 to 0.04 mm, preferably from 0.001 to 0.02 mm. Examples of preferred bases are roughened or etched sheets of zinc, aluminum or chromium, and papers coated with carboxymethylcellulose. If desired, adhesion promoters such as carboxymethylcellulose may be added to the photosensitive material.

The dried plate may then, if desired, be heated prior to exposure in a drying cabinet for a short period of time at 80° to 180°C. The drying time and drying temperature depend on the composition of the photosensitive mixture and can be determined in each case by a few simple experiments. Afterwards the plate is exposed through a halftone transparency in a conventional exposure unit for about 0.1 to 20 minutes. The exposure time depends on the power of the light source used and on the composition of the photoactive coating material. Here again, it may be readily determined by a few preliminary experiments.

Lamps emitting light having a wavelength of from 2000 to 6000 A, such as xenon lamps, fluorescent lamps, high-pressure mercury vapor lamps and carbon arc lamps, are very advantageous for exposing the coated sheets.

Following exposure, the exposed areas can be washed out with an alkaline solvent or solvent mixture. The pH value of the solvent liquid is advantageously higher than 7.5, at least part of the free carboxyl groups being converted into the salt. The pH value is of course dependent on the coating material used and can be easily determined by a preliminary experiment.

Borax, disodium hydrogen phosphate, soda ash, alkali hydroxides and organic bases, such as diethanolamine and triethanolamine, may be used as alkalis for the solvent solution. The solvent with the alkaline additive may in the simplest case be water, but organic solvents such as alcohols, particularly methanol and ethanol, ketones, particularly acetone, or cyclic ethers such as tetrahydrofuran and dioxane may be used alone or in admixture with water. It is also possible to use mixtures of the said organic solvents either alone or in admixture with water.

The washout solution may also contain additives, such as surface-active substances, sodium carboxymethylcellulose, polyvinyl alcohol and polysodium acrylate.

To produce photoresists with the material of the invention, the photosensitive polymer containing o-nitrocarbinol ester groups in suitable solvents, such as tetrahydrofuran, is applied by a conventional method to the substrate to be etched, e.g. a degreased copper-coated plastics film, in such an amount that, after evaporation of the solvent, there is obtained a layer having a thickness of from 0.001 to 0.05 mm, preferably from 0.001 to 0.003 mm. After exposure through a positive transparency and washout with aqueous alkali, the uncovered areas of the copper coating can be etched away with nitric acid. The non-etched areas of the copper coating can then be uncovered by treatment with a solvent.

The invention is illustrated by the following examples in which parts and percentages are by weight unless otherwise stated. Parts by weight bear the same relation to parts by volume as the kilogram to the liter.

EXAMPLE 1*a*

Production of an alternating copolymer of styrene and o-nitrobenzyl maleic acid hemiester 47.4 parts of an alternating copolymer of styrene and maleic anhydride (prepared according to D. Braun. H. Cherdron and W. Kern, Praktikum der makromolekularen organischen Chemie, Heidelberg, 1966, page 175) and 40 parts of o-nitrobenzyl alcohol are dissolved in 200 parts by volume of ethyl acetate. The solution is boiled for 1 hour under reflux following the addition of 0.5 part by volume of concentrated phosphoric acid, and the solvent is then distilled off. The residue is kept at a temperature of 110°C for 1 hour, cooled, dissolved in 200 parts by volume of ethyl acetate and precipitated in 1000 parts by volume of methanol. The precipitate is suction filtered and dried at 80°C in a drying cabinet. 58 parts of a brown brittle material is obtained which has a molecular weight of 2140. The reaction does not proceed to completion, which is shown by the following analytical data:

ultimate analysis reveals 2.9% nitrogen (theoretical value 3.9% N);

titration with normal aqueous caustic solution reveals 62.2% free carboxyl, as compared with a theoretical value of 50%.

EXAMPLE 1*b*

Production of planographic printing plates

The polymer prepared according to Example 1*a* is dissolved in ethyl acetate. The resulting solution is applied to commercially available sheets of anodized aluminum in such an amount that, after evaporation of the solvent, there is obtained a layer 4 $\mu$ in thickness. The dried coated plate is exposed for 5 minutes through a halftone transparency in a flat-plate exposure unit manufactured by Firma Moll, Solingen, Germany, and provided with 30, 40-watt fluorescent tubes (Sylvania 40 BLB). The exposed areas are washed out with a 0.1 molar aqueous borax solution. When mounted on a Rotaprint small offset press, the resulting lithographic plate produces 10,000 printed copies of uniformly excellent quality.

EXAMPLE 1*c*

Thermostability test

The outstanding thermostability and storage stability of the material of the invention is shown here. A lithographic plate prepared and exposed according to Example 1*b* is stored for 10 days in a through-circulation dryer at 170°C. The plate is then washed out with borax solution and printed as described in Example 1*b*. The quality of the printed copies is the same as that of the printings obtained in Example 1*b*.

EXAMPLES 1*d* to 1*i*

Photosensitivity test

Pieces of printing plate prepared according to Example 1*b* measuring 5 × 5 cm are exposed for various lengths of time. Table 1 below gives the results obtained after washing out the exposed areas with 0.1 molar aqueous borax solution.

TABLE 1

| Example | Exposure time | Result |
|---|---|---|
| 1*d* | 5 seconds | no washout |
| 1*e* | 10 seconds | insufficient washout |
| 1*f* | 15 seconds | insufficient washout |
| 1*g* | 20 seconds | sufficient washout |
| 1*h* | 25 seconds | good washout |
| 1*i* | 30 seconds | very good washout |

EXAMPLE 2

This example shows that the nitro group in the photosensitive coating material of the invention must be in a position ortho to the carbonyl ester group. The polycarboxylic anhydride is esterified as described in Example 1*a* except that p-nitrobenzyl alcohol and m-nitrobenzyl alcohol are used instead of o-nitrobenzyl alcohol. The yields and the analytical data of the resulting copolymers are almost the same as in Example 1*a*. A lithographic plate is prepared and exposed as described in Example 1*b*. The exposed areas cannot be washed out with 0.1 molar aqueous borax solution. Only after exposing the plate for 1 hour can only some areas be washed out, and then only insufficiently.

EXAMPLE 3

The procedure of Example 1*a* is followed except that the o-nitrobenzyl alcohol is replaced by 70 parts of o-nitrobenzhydrol. 90 parts of a brown copolymer is obtained which is used to produce lithographic plates according to Example 1*b*.

EXAMPLE 4

The procedure of Example 1*a* is followed except that the o-nitrobenzyl alcohol is replaced by 80 parts of 1-nitroanthraquinone-2-carbinol. The resulting dark brown copolymer is dissolved in dimethyl formamide, following which lithographic plates are prepared as described in Example 1*b*. After exposure and washout with 1N aqueous caustic, a plate is obtained whose unexposed areas are extremely resistant to abrasion.

EXAMPLE 5

About 100 parts of each of the following alternating copolymers are prepared by precipitation polymerization in benzene under nitrogen using azoisobutyronitrile as free-radical-generating polymerization initiator: maleic anhydride/acrylonitrile, maleic anhydride/vinyl acetate and acrylic anhydride/methyl methacrylate. Each copolymer is dissolved in dioxane and boiled under reflux for 2 hours with 1½ times the stoichiometric amount of 6-nitroverytryl alcohol. The reaction product is then precipitated in methanol which has been slightly acidified with hydrochloric acid, suction filtered and dried. The polymers are soluble in dioxane and can be cast on polyester film to form a layer 10 μ in thickness. After exposure for 2 minutes the exposed areas of the layer can be washed out with a 0.1% solution of triethanolamine in methanol.

EXAMPLE 6

10 parts of the copolymer of styrene and maleic anhydride described in Example 1*a* is suspended in 100 parts by volume of water, and concentrated aqueous caustic is added until the copolymer is completely dissolved. 30 parts of o-nitrobenzyl chloride is then added and the whole is heated to the boil. An emulsion of the molten chloride is formed first. After about 20 to 30 minutes a brown copolymer precipitates which is immediately filtered off, dissolved in dioxane and precipitated from methanol acidified with hydrochloric acid. 17 parts of a brown polymer is obtained. Titration reveals 23.1% free carboxyl.

The polymer is dissolved in tetrahydrofuran and applied to a copper-coated plastics film in such an amount that, after evaporation of the solvent, there is obtained a layer 1 μ in thickness. The plate is then exposed for 10 minutes through a line positive. The exposed areas are washed away using a solution of 1 part of triethanolamine, 90 parts of water and 9 parts of dioxane. The uncovered copper is then dissolved away by treatment with concentrated nitric acid. The remaining polymer coating is finally removed with dimethyl formamide and there is obtained an electronic component.

EXAMPLE 7

The procedure described in Example 6 for preparing a photosensitive coating material is followed except that the o-nitrobenzyl chloride is replaced by 50 parts of o-nitrobenzyl bromide. The reaction is over after heating up to 70°C within a short period of time.

EXAMPLE 8

A mixture of 100 parts of 2,4-dinitrobenzyl chloride and 56 parts of styrene/maleic acid copolymer in 1000 parts of water is adjusted to a pH of 6.8 with hydrochloric acid and then boiled under reflux for 90 minutes with stirring. The precipitated reddish brown rubbery polymer is separated, washed with water and dissolved in dimethyl formamide acidified with hydrochloric acid. It is then precipitated in methanol slightly acidified with hydrochloric acid and dried in vacuo, the yield being 105 parts. Titration reveals 21% free carboxyl.

10 parts of the polymer and 0.1 part of Palanil marine blue RE are dissolved in 300 parts by volume of dimethyl formamide, and a lithographic plate is produced as described in Example 1*b*. This plate produces 100,000 printed copies on a commercially available printing press without the printing quality suffering appreciably.

EXAMPLE 9 a. Production of o-nitrobenzyl acrylate

A mixture of 15.3 parts of o-nitrobenzyl alcohol, 35 parts of methyl acrylate, 1 part of titanium tetrabutylate and 0.15 part of p-methoxyphenol are heated to the boil in a flask. A mixture of methanol and methyl acrylate is slowly distilled off through a column. The remaining mixture is subjected to vacuum distillation after working up in a conventional manner. 18 parts of vaporous fraction distils at 1 mm Hg at 113° to 116°C. The substance is shown to be homogeneous by thin-layer chromatography. Ultimate analysis gives the following values:

| | | | | |
|---|---|---|---|---|
| found: | 57.7% C, | 4.6% H, | 6.7% N, | 31.0% O |
| calc.: | 58.0% C, | 4.3% H, | 6.8% N, | 30.9% O. |

b. Production of o-nitrobenzyl methacrylate 76.5 parts of o-nitrobenzyl alcohol and 0.5 part of hydroquinone are dissolved in a mixture of 50.5 parts of triethylamine and 400 parts of benzene in a three-necked, round-bottomed flask. A mixture of 53 parts of methacrylyl chloride and 300 parts of benzene is dripped in while stirring and cooling with ice. After stirring for 3 hours at room temperature the triethylammonium chloride is suction filtered and the benzolic solution is washed with sodium carbonate solution until it is neutral. After distilling off the benzene, vacuum distillation is effected. 90 parts distil at 1.5 mm Hg at a temperature of from 143° to 146°C. The ultimate analysis and infrared spectrum values of the distillate accord well with the theoretical values.

c. Polymerization of o-nitrobenzyl acrylate 30 parts of o-nitrobenzyl acrylate and 0.45 part of azoisobutyronitrile are dissolved in 150 parts by volume of benzene. The mixture is heated to boiling point under nitrogen and boiled under reflux for 11 hours. After cooling, the solution is dripped into 750 parts by volume of ligroin with stirring, a white flocculent polymer being precipitated. The product is filtered off and dried. 27.5 parts of polymer is obtained which dissolves well in tetrahydrofuran.

The molar absorptivity was measured at 360 m$\mu$: $\epsilon_{360}$ = *550* l/mol × cm.

d. Production of a printing plate

A roughened sheet of aluminum is coated on a whirler with an 8% solution of the polymer prepared according to Example 9*a* in dioxane. After the solvent has evaporated, the coated sheet is heated in a drying cabinet at 90°C for 5 minutes and then exposed through a halftone positive for 5 minutes as described in Example 1*b*. The exposed plate is immersed in a mixture of 70 parts by volume of 0.1 molar borax solution and 30 parts by volume of tetrahydrofuran for 30 seconds, rubbed with a pad of cotton wool using fresh developer, dipped into a 2% aqueous phosphoric acid solution and inked with conventional offset printing ink.

EXAMPLE 10 a. Production of the photosensitive copolymer 30 parts of o-nitrobenzyl acrylate and 3.7 parts of N-methylolacrylamide are dissolved in 250 parts by volume of ethyl acetate and then 0.5 part of azoisobutyronitrile is added. After gassing with nitrogen, polymerization is carried out for 9 hours at 70°C. The copolymer is precipitated by dripping in n-butanol, filtered off and dried. The yield is 32 parts of a slightly yellow powder.

b. Production of a printing plate

An anodized aluminum offset plate is coated with a 6% solution of the copolymer described above under (*a*) which contains 1%, based on the amount of polymer, of Palanil marine blue RE. After drying for 3 minutes at 80°C, the coated plate is exposed through a positive transparency using a xenon lamp. The plate is developed with a mixture of 900 parts of water, 100 parts of diethanolamine and 0.5 part of Nekal AEM (anionic wetting agent manufactured by Badische Anilin- & Soda-Fabrik AG, 6700 Ludwigshafen, Germany) in a conventional manner using a plush pad. After spraying with water, the plate is dried, rendered hydrophilic and inked. This offset plate has a very long press life which can be considerably lengthened by tempering at 140°C for 10 minutes.

EXAMPLE 11 a. Production of a photosensitive terpolymer 6 parts of o-nitrobenzyl methacrylate, 1.95 parts of styrene, 0.7 part of acrylic acid and 0.18 part of azoisobutyronitrile are dissolved in 20 parts by volume of benzene. Atmospheric oxygen is expelled by nitrogen and heating is then effected for 9 hours at 80°C. The terpolymer is precipitated in ligroin and dried in vacuo at 40°C. The yield is 8 parts.

b. Production of a printing plate

A sand-blasted aluminum sheet is coated with a 7.5% solution of the photosensitive copolymer in dioxane, which solution contains 0.4 part of methyl violet per 100 parts by volume of solution, on a whirler at 100 r.p.m. After drying for 3 minutes at 80°C, the coated plate is exposed through a positive for 3 minutes using a carbon arc lamp. The plate is developed by spraying it with a solution of 850 parts by volume of a 0.5% disodium hydrogen phosphate solution, 100 parts by volume of acetone and 50 parts by volume of tetrahydrofuran. After rinsing with alcohol and water, the plate is inked with pale ink and is then ready for printing. The exposed plate can also be developed by hand using a pad of cotton wool moistened with a 0.1 molar borax solution containing 1% of commercially available soap flakes. The plate is then rinsed with water, dipped into a 1.5% aqueous phosphoric acid solution and inked. When mounted on a conventional offset printing press, the plate produces 100,000 printed copies of good quality.

EXAMPLE 12 a. Production of photosensitive copolymer 12 parts of o-nitrobenzyl acrylate, 1.65 parts of N-vinylpyrrolidone and 0.28 part of benzoyl peroxide are dissolved in 125 parts by volume of ethyl acetate. The solution is boiled under reflux for 8 hours under a weak stream of nitrogen. The copolymer is not isolated from this solution which is used direct to coat a sheet of aluminum.

b. Production of a printing plate 0.135 part of Palanil marine blue RE is dissolved in the solution described above under (*a*). An aluminum base which has been roughened by brushing is coated on a whirler with the resulting solution. The coated plate is dried for 3 minutes at 80°C and then exposed for 2 minutes as described in Example 10*b*.

The developer solution used consists of 80 parts by volume of a 0.2% aqueous sodium carbonate solution and 20 parts by volume of acetone. The plate is then rinsed with water, immersed in a 1% aqueous phosphoric acid solution and then inked with conventional offset printing ink.

EXAMPLE 13 a. Production of a photosensitive copolymer 10 parts of 3-methoxy-4-(2-nitratoethoxyl-1)-6-nitrobenzyl acrylate and 0.5 part of acrylic acid in 100 parts by volume of benzene are polymerized under reflux for 4 hours under nitrogen using 0.1 part of azoisobutyric acid as initiator. The reddish yellow polymer is precipitated in methanol, suction filtered and dried in the air.

b. Use of the coating material as photoresist

The polymer prepared according to (*a*) is dissolved in tetrahydrofuran. A sheet of glass to which a layer of aluminum 1 $\mu$ in thickness has been applied is coated by dipping it into the polymer solution, the thickness of the resulting coating being 0.7 $\mu$. After exposing the coating through the positive transparency of an electronic component, it is developed with a solution of 3 parts of sodium phosphate, 20 parts by volume of dioxane and 70 parts by volume of water, i.e. the exposed areas are washed out. The uncovered aluminum is then etched away with a solution of 1000 parts by volume of phosphoric acid, 100 parts by volume of nitric acid, 100 parts by volume of glacial acetic acid and 100 parts by volume of water in the course of 20 seconds. The unexposed areas are then washed away with acetone to reveal the finished photoresist which under a microscope is found to have a resolution of less than 1 $\mu$.

We claim:

1. A lithographic printing plate comprising a support and a layer of a photosensitive coating material on said support, said material consisting essentially of a polymer having a molecular weight of more than 500 and containing in the molecule such an amount but at least 5% by weight, with reference to the molecular weight, of aromatic or heteroaromatic o-nitrocarbinol ester groups of the formula I:

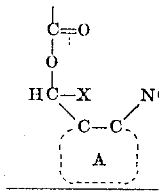

(I)

where A denotes an aromatic or pyridine system having 5 to 14 ring members, X denotes hydrogen, an alkyl of 1 to 8 carbon atoms or an aryl or aralkyl that its exposed areas can be washed out after exposure with an alkaline solvent or solvent mixture used as developer in which the said coating material was insoluble prior to exposure.

2. A photoresist comprising a substrate to be etched to which has been applied a photosensitive coating material consisting essentially of a polymer having a molecular weight of more than 500 and containing in the molecule such an amount but at least 5% by weight, with reference to the molecular weight, of aromatic or heteroaromatic o-nitrocarbinol ester groups of the formula I:

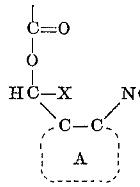

(I)

where A denotes an aromatic or pyridine system having 5 to 14 ring members, X denotes hydrogen, an alkyl of 1 to 8 carbon atoms or an aryl or aralkyl that its exposed areas can be washed out after exposure with an alkaline solvent or solvent mixture used as developer in which the said coating material was insoluble prior to exposure.

* * * * *